United States Patent
Seidl

(10) Patent No.: US 8,188,569 B2
(45) Date of Patent: May 29, 2012

(54) PHASE CHANGE RANDOM ACCESS MEMORY DEVICE WITH TRANSISTOR, AND METHOD FOR FABRICATING A MEMORY DEVICE

(75) Inventor: Harald Seidl, Pöring (DE)

(73) Assignee: Qimonda AG, Munich (DE)

( * ) Notice: Subject to any disclaimer, the term of this patent is extended or adjusted under 35 U.S.C. 154(b) by 300 days.

(21) Appl. No.: 11/640,065

(22) Filed: Dec. 15, 2006

(65) Prior Publication Data
US 2008/0142776 A1 Jun. 19, 2008

(51) Int. Cl.
| H01L 23/52 | (2006.01) |
| H01L 29/00 | (2006.01) |
| G11C 11/00 | (2006.01) |

(52) U.S. Cl. ........... 257/529; 257/E45.002; 257/350; 257/379; 257/528; 365/148; 365/163

(58) Field of Classification Search ........ 257/E45.002, 257/246, 379, 350, 529, E27.098; 977/762
See application file for complete search history.

(56) References Cited

U.S. PATENT DOCUMENTS

| 6,312,304 | B1* | 11/2001 | Duthaler et al. ............ 445/24 |
| 6,611,039 | B2* | 8/2003 | Anthony .................. 257/529 |
| 6,787,450 | B2 | 9/2004 | Sinha et al. |
| 6,969,866 | B1* | 11/2005 | Lowrey et al. ............ 257/3 |
| 7,323,730 | B2* | 1/2008 | Borghetti et al. .......... 257/290 |
| 2003/0209746 | A1* | 11/2003 | Horii .................... 257/295 |
| 2004/0219773 | A1* | 11/2004 | Choi et al. ............. 438/597 |
| 2005/0130414 | A1* | 6/2005 | Choi et al. ............. 438/672 |
| 2006/0034116 | A1* | 2/2006 | Lam et al. ............. 365/151 |
| 2007/0012956 | A1* | 1/2007 | Gutsche et al. ........... 257/246 |
| 2007/0012986 | A1* | 1/2007 | Choi et al. ............. 257/306 |

OTHER PUBLICATIONS

Zhang, Y. et al., "A Simple Method to Synthesize Nanowires," American Chemical Society, Chem. Mater. 14, pp. 3564-3568 (2002).
Gundiah, G. et al., "Synthesis and Characterization of Silicon Carbide, Silicon Oxynitride and Silicon Nitride Nanowires," J. Mater. Chem., 12, pp. 1606-1611 (2002).
Rath, C. et al., "Si-N Nanowire Formation from Silicon Nano and Microparticles," Mat. Res. Soc. Symp. Proc. vol. 789, pp. 59-63 (2004).
Seong, H. et al., "Optical and Electrical Transport Properties in Silicon Carbide Nanowires," American Institute of Physics, Applied Physics Letters, vol. 85, No. 7, pp. 1256-1258 (Aug. 16, 2004).
Lieber, C., "NanoSeconds: Nanowire Superlattices," American Chemical Society, Nano Letters, vol. 2, No. 2, 81-82 (Feb. 2002).
Ma, R. et al., "Investigation on the Growth of Boron Carbide Nanowires," American Chemical Society, Chem. Mater., vol. 14, No. 10, pp. 4403-4407 (2002).

(Continued)

Primary Examiner — Lynne Gurley
Assistant Examiner — Jesse Y Miyoshi
(74) Attorney, Agent, or Firm — Dicke, Billig & Czaja, PLLC

(57) ABSTRACT

The invention relates to a memory device, in particular to a resistively switching memory device such as a Phase Change Random Access Memory ("PCRAM"). In one disclosed method, a nanowire of non-conducting material is formed serving as a mould for producing a nanotube of conducting material. A volume of switching active material is deposited on top of the nanotube, so that the ring-shaped front face of the nanotube couples to the switching active material and thus forms a bottom electrode contact.

25 Claims, 15 Drawing Sheets

OTHER PUBLICATIONS

Sun, X. et al., "Formation of Silicon Carbide Nanotubes and Nanowires via Reaction of Silicon (from Disproportionation of Silicon Monoxide) with Carbon Nanotubes," American Chemical Society, J. Am. Chem. Soc., vol. 124, No. 48, pp. 14465-14471 (2002).

Cui, Y. et al., "Diameter-controlled Synthesis of Single-Crystal Silicon Nanowires," American Institute of Physics, Applied Physics Letter, vol. 78, No. 15, pp. 2214-2216 (Apr. 9, 2001).

Hu, J. et al., "Fabrication of ZnS/SiC Nanocables, SiC-Shelled ZnS Nanoribbons (and Sheets), and SiC Nanotubes (and Tubes)," American Institute of Physics, Applied Physics Letter, vol. 85, No. 14, pp. 2932-2934 (Oct. 4, 2004).

Han, W. et al., "Synthesis of Boron Nitride Nanotubes from Carbon Nanotubes by a Substitution Reaction," American Institute of Physics, Applied Physics Letter, vol. 73, No. 21, pp. 3085-3087 (Nov. 23, 1998).

* cited by examiner

PHASE CHANGE RANDOM ACCESS MEMORY DEVICE WITH TRANSISTOR, AND METHOD FOR FABRICATING A MEMORY DEVICE

BACKGROUND

The invention relates to a memory device, in particular to a resistively switching memory device such as a Phase Change Random Access Memory ("PCRAM"). Further, the invention relates to a method for fabricating said memory device, in particular a Phase Change Random Access Memory device.

In so-called resistive or resistively switching memory devices an active or switching active material can be switched by an appropriate switching process into a first, conducting state and a second, non or less conducting state wherein the conducting state corresponds to a logic "one" and the less conducting state can be assigned a logic "zero", or vice versa. A first kind of these memory devices is so-called Phase Change Random Access Memory, hereinafter called PCRAM. Furthermore so-called Conductive Bridge Random Access Memory ("CBRAM") and other types of resistively switching memory types are known.

In particular for PCRAM a chalcogenide or chalcogenide compound can be used as a "switching active" material, e.g. a Ge—Sb—Te (GST) or an AG-In—Sb—Te compound. This "switching active", e.g. the chalcogenide material, can be switched between an amorphous and a crystalline state, wherein the amorphous state is the relatively weakly conducting state, which accordingly can be assigned a logic zero, and the crystalline state, i.e. a relatively strongly conductive state, accordingly can be assigned a logic one. In the following this material will be referred to as the switching active material.

To achieve a change from the amorphous, i.e. a relatively weakly conductive state of the switching active material, to a crystalline, i.e. a relatively strongly conductive state, the material has to be heated. For this purpose a heating current pulse is sent through material, which heats the switching active material beyond its crystallization temperature thus lowering its resistance. In this way the value of a memory cell can be set to a first logic state, i.e. a logic one.

Vice versa, the switching material can be heated by applying a relatively high current to the cell which causes the switching active material to melt and by subsequently "quench cooling" the material can brought into an amorphous, i.e. relatively weakly conductive state, which may be assigned the second logic state, that is to reset the first logic state.

Typically, the heating current pulses are provided via respective source lines and bit lines, wherein the current pulse is controlled by selection transistor, with which a memory cell can be selected from an array of memory cells arranged in a memory device, which typically is an integrated circuit (IC). The state of said selection transistor typically is controlled by a word line, which is coupled to the gate of the selection transistor. The drain of the selection transistor is coupled to the switching active material, such that a current flowing through the selection transistor is conducted through the switching active material, thus the heating current pulse is controlled by the transistor.

An ever-challenging problem is to reduce the size of such a memory cell. One approach known from prior art is to improve the thermal isolation of a cell to accelerate the process of heating. Furthermore attempts have been made to limit the size of the current path in order to concentrate the current onto a small area and thus to achieve a high current density within the switching active material.

To further reduce the size of such a memory cell and to improve the behavior there is a need for the present invention.

SUMMARY

According to an aspect of the invention, an integrated circuit including an array of memory cells is disclosed, wherein each memory cell includes a volume of switching active material, said volume of switching active material being contacted by a ring-shaped contact formed around a non-conducting nanowire.

Also described is an integrated circuit with a plurality of memory cells, each memory cell including a volume of switching active material and a selection element and a nanotube of conducting material formed as a layer of conducting material around surrounding a nanowire of non-conducting material, wherein the volume of switching active material is coupled to the selection element via the nanotube and wherein a first ring-shaped front face of the nanotube forms a contact to the volume of switching active material.

Furthermore an integrated circuit with a plurality of memory cells formed on a wafer is disclosed, wherein the surface of the original wafer serves as a horizontal reference plane, and wherein each of the memory cells includes:
  a volume of switching active material and
  a selection element for selecting one memory cell from the plurality of memory cells and
  a nanotube of conducting material for connecting the volume of switching active material, the rotation axis of the nanotube being perpendicular to the reference plane, the nanotube formed as a layer of conducting material surrounding a nanowire of non-conducting material,
wherein the ring-shaped front face at a first end of the nanotube forms a contact to the volume of switching active material.

According to another aspect of the invention a method of producing an integrated circuit comprising a plurality of memory cells on a wafer is described, wherein the original surface of the wafer forms a horizontal reference plane, and wherein each memory cell comprises a volume of switching active material and a selection element for selecting one memory cell from the plurality of memory cells, the method includes:
  forming a nanotube of a conducting material, wherein the rotation-axis of the nanotube is arranged perpendicular to the reference plane and wherein the nanotube is coupled to the drain of the selection element;
  depositing a volume of switching active material on the front face of the nanotube, the front face thus forming a ring shaped contact to the volume of switching active material.

Also disclosed is a method of producing an integrated circuit comprising a plurality of memory cells on a wafer, the original surface of the wafer forming a horizontal reference plane, and wherein each memory cell includes a volume of switching active material and a selection element for selecting one of the plurality of memory cells, the method comprising the following steps:
  forming a selection element comprising a source/drain;
  depositing a catalyst on the source/drain, by an electroless deposition method;
  growing a nanowire on the catalyst, the rotation-axis perpendicular to the reference plane;
  depositing a layer of conducting material on the wafer, wherein the layer of conducting material covers the sidewall of the nanowire;

performing an anisotropic spacer etch removing the conducting material from horizontal surfaces but prevailing the material on vertical surfaces thus forming a nanotube; and depositing a volume of switching active material on the front face of the nanotube thus coupling the volume of switching active material to the front face of the nanotube.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
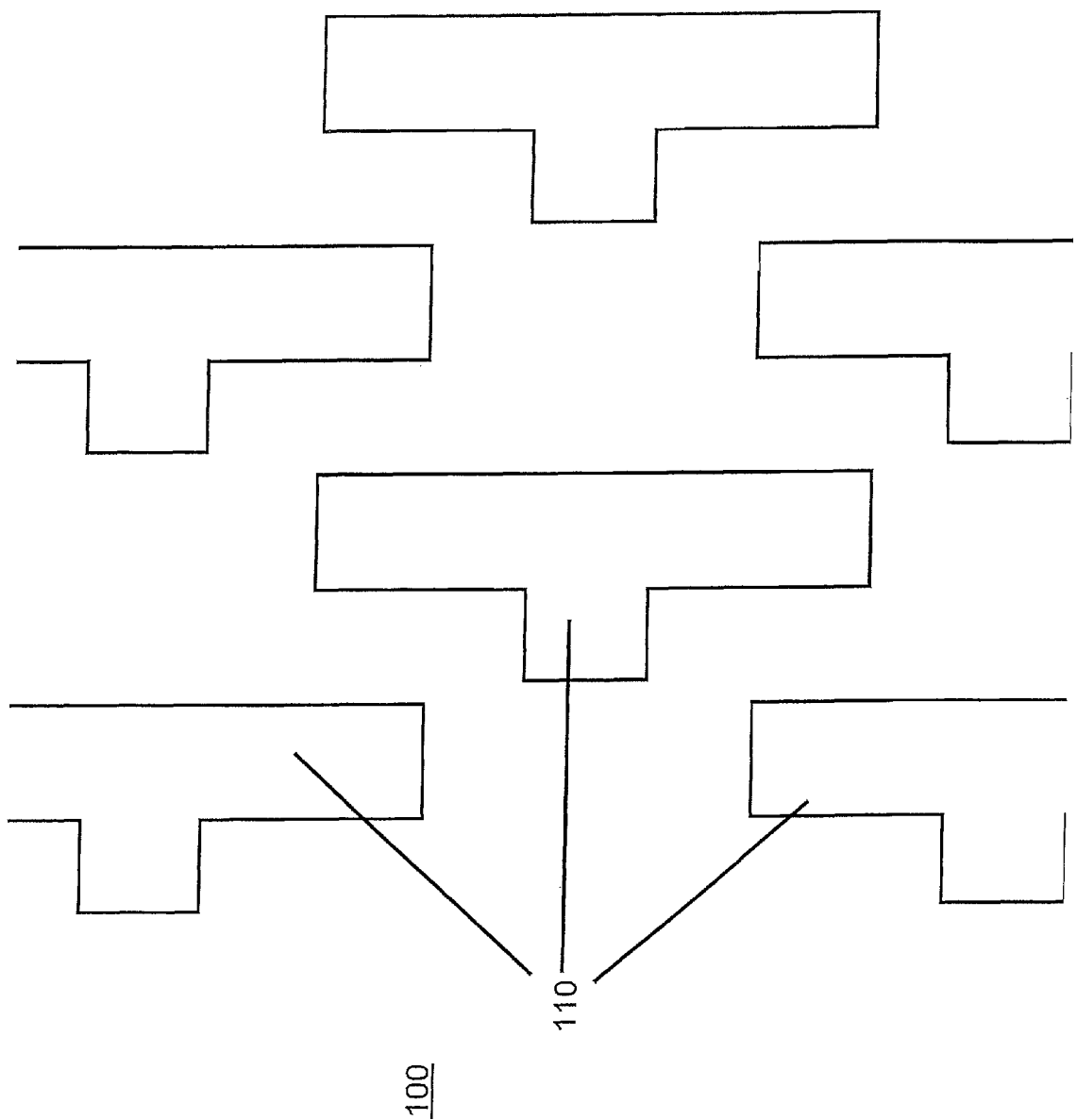
FIG. 1 schematically depicts a first top view on a wafer

FIG. 1 depicts schematically a top view on a wafer showing the layout of active areas 110, wherein the active areas 110 are formed from the original wafer material Si. These active areas are embedded in a shallow trench isolation (STI) 100 formed from any suitable insulating material, which typically is silicon oxide SiO2. In this processing stage the STI 100 forms a planar surface, which will serve as a horizontal reference throughout the following description. Actually, the active areas 110 are covered by gate oxide, which is not shown here. However reference sign 110 shows the contour and location of the active areas 110.

As shown in the drawing the active areas are arranged in a staggered manner. The active areas of adjacent columns are staggered by one half of the periodicity of the active areas in a column.

Figure 2:
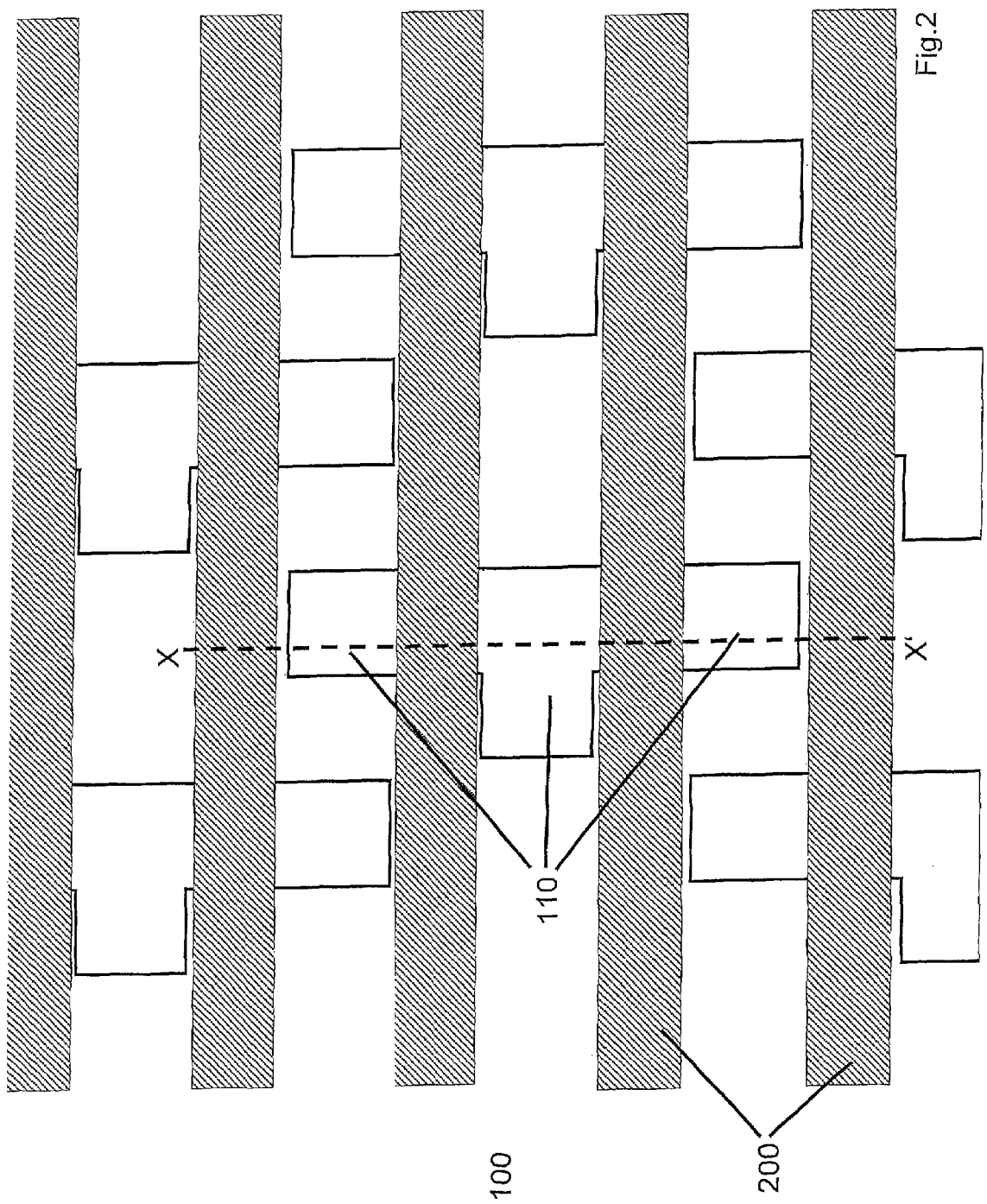
FIG. 2 schematically depicts the top view of FIG. 1 after deposition of the gate layer

FIG. 2 depicts a view on the wafer after transistor gates have been formed as lines, such that a pair of parallel lines runs across a plurality of active areas 110. A suitable insulating layer, which can be silicon nitride SiN or any other suitable insulating material covers the lines forming the transistor gates. Consequently in this view the insulating covers 200 upon the lines are visible, whereas the gate lines are hidden below the covers 200.

Dotted line X-X' denotes the length and the direction of a cut line through the wafer, which in this figure runs into the paper plane.

Figure 3:
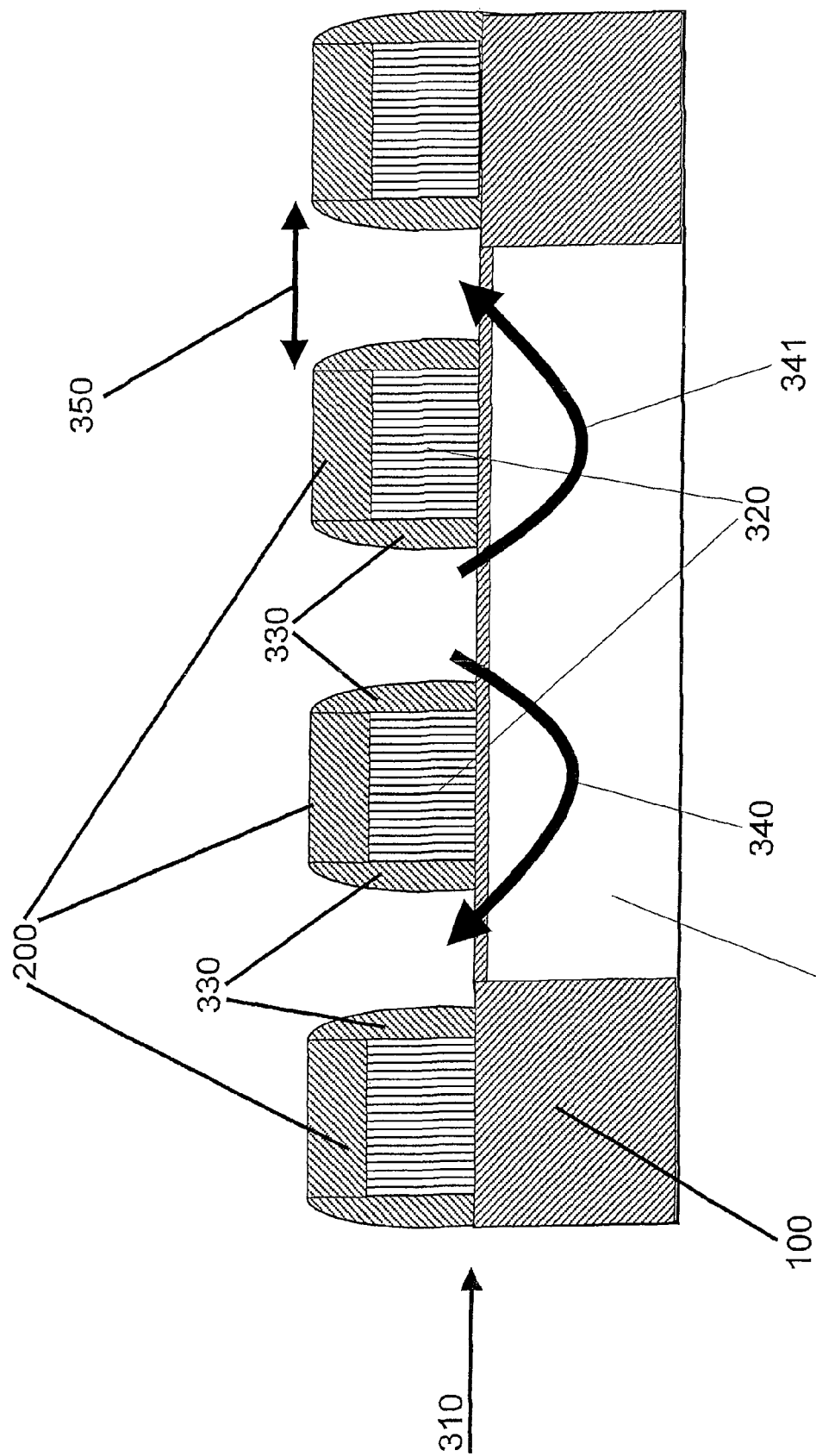
FIG. 3 illustrates a cross sectional view through an active area

FIG. 3 depicts a cross sectional view along the cut line X-X' as shown in FIG. 2.

The arrow denoted by reference numeral 310 denotes the surface of the wafer serving as a reference plane, wherein the surface is the top surface of the STI 100.

As mentioned above the active area 110 is embedded into the STI 100 and also covered by a thin layer of SiO2 material. Two parallel gate lines 320, each forming one transistor gate when running across the active area 110, run across the active area 110. The gate lines 320 are electrically insulated from the active area 110 by the thin layer of insulating material, which thus forms a gate dielectric. The material of the gate lines can be poly silicon or any other suitable conducting material or a stack of different layers, for example a stack of poly silicon below a suitable metal such as tungsten (W) and an insulating top layer such as silicon nitride SiN.

With reference to area 110 each of the gate lines 320 serves as a gate for one selection transistor, thus the area denoted by reference numeral 110 will actually form two active areas of two respective, adjacent selection transistors.

The two transistors will have a common source, which will be formed in later processing steps. The drains of the transistors are at the right hand end and at the left hand end respectively of area 110. Reference numerals 340, 341 thus denote the pathway of the current through the active area of a first and a second transistor respectively.

Also as mentioned above the gate lines 320 are covered by a layer of insulating material 200. The sidewalls of the gate lines 320 are covered by insulating spacers 330, which have been produced by depositing a layer of suitable insulating material, in one case the same material, e.g. SiN, as used for the covering layer, and subsequent anisotropic etching. According to the anisotropic etching the bottom region of a spacer is thicker than the top region of a spacer.

Source/Drain formation (not shown in the figures) with LDD (Low Density Drain) structure is performed by standard ion-implantation processes well known to those skilled in the art.

Subsequently a liner of a suitable insulating material, e.g. SiN, can be deposited optionally, in order to protect the active areas in subsequent etching steps.

Although the Figures are not drawn to scale arrow 350 denotes the distance between two gate lines 320, which can be 65 nanometers in this embodiment. Accordingly half-pitch size is 65 nanometers.

In a subsequent processing step a suitable interlayer dielectric (ILD), for example such as silicon oxide (SiO) is deposited. The surface of said ILD is then planarized, for example by using a conventional chemical-mechanical polishing (CMP) processing.

Figure 4:
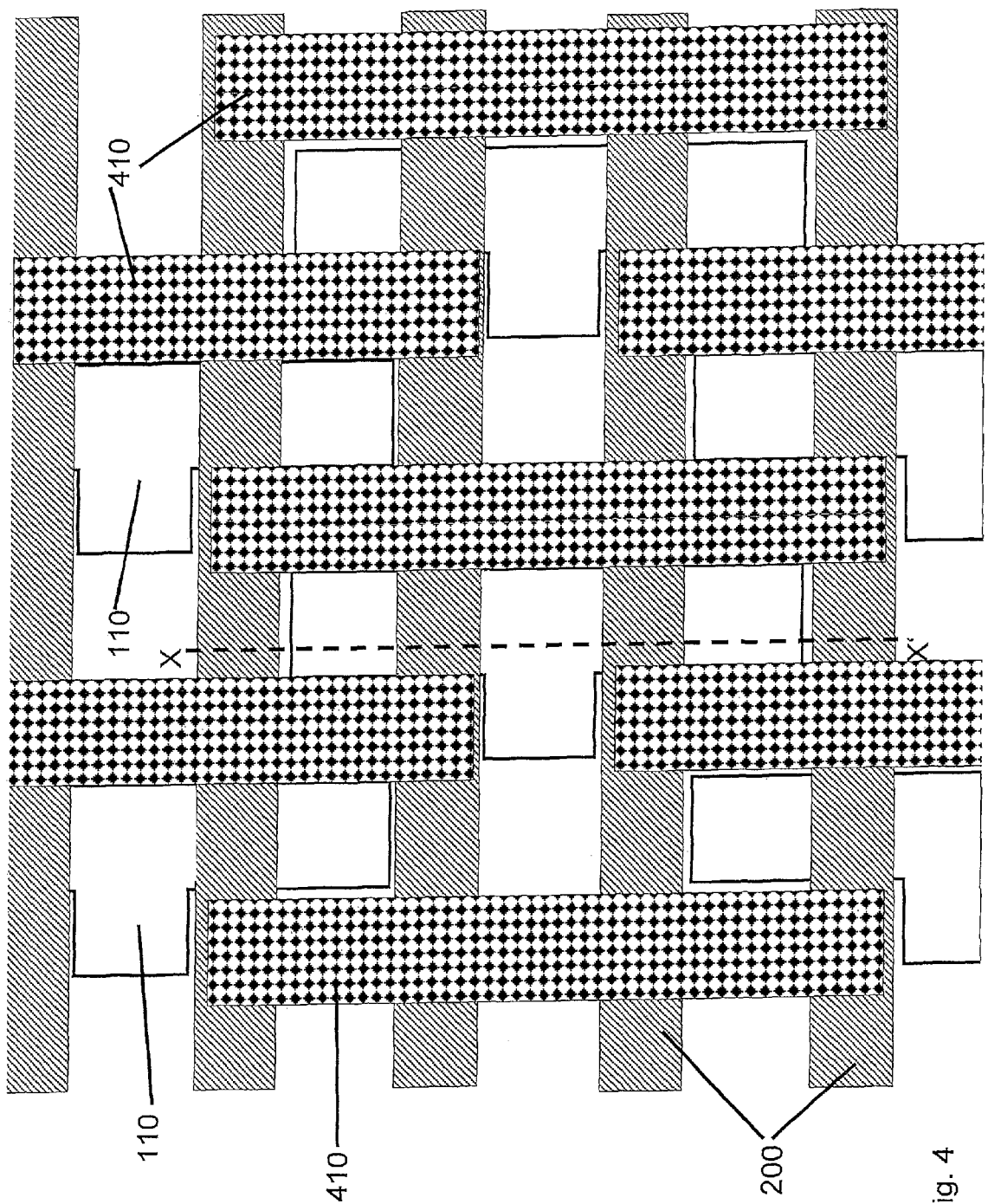
FIG. 4 depicts a the top view of FIG. 2 after deposition of stripes of ILD

FIG. 4 depicts a top view on the surface of the wafer, wherein the ILD is omitted, as it would otherwise hide the structure, and showing stripes of a photo resist 410 positioned on the wafer. The stripes have been produced by a conventional processing, for example by depositing a layer photo resist on the entire wafer surface and subsequent lithographic steps and etching. Subsequently the ILD material is removed by etching, wherein due to the photo resist the ILD is maintained under the stripes.

After removing the photo resist, silicon is deposited on the structure, for example by using a chemical vapor deposition (CVD), such that gaps between the ILD under the stripes 410 and the gate lines 320 are filled. Said layer of silicon is then planarized by conventional CMP processing with reference to the top of the gate line covers 200.

Figure 5:
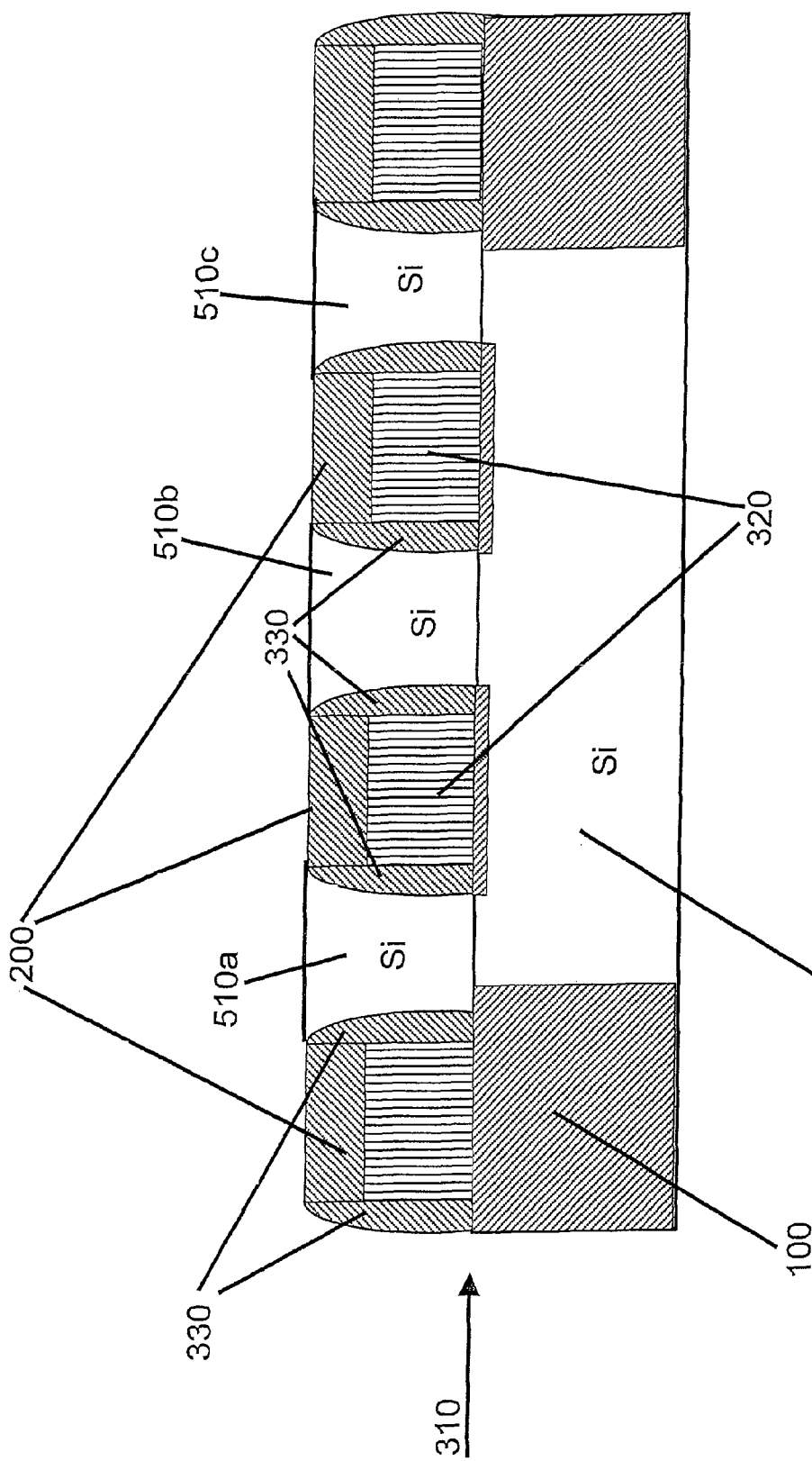
FIG. 5 depicts the cross sectional view of FIG. 3 after deposition of gap filling silicon

FIG. 5 depicts a cross sectional view along cut line X-X' after depositing and planarizing the just deposited layer of silicon. In this way the gaps between the gate lines are filled with silicon, denoted by reference numerals 510*a*, 510*b* and 510*c*, wherein 510*a* and 510*c* will each serve as a drain contact for a transistor having 510*b* as a common source.

Figure 6:
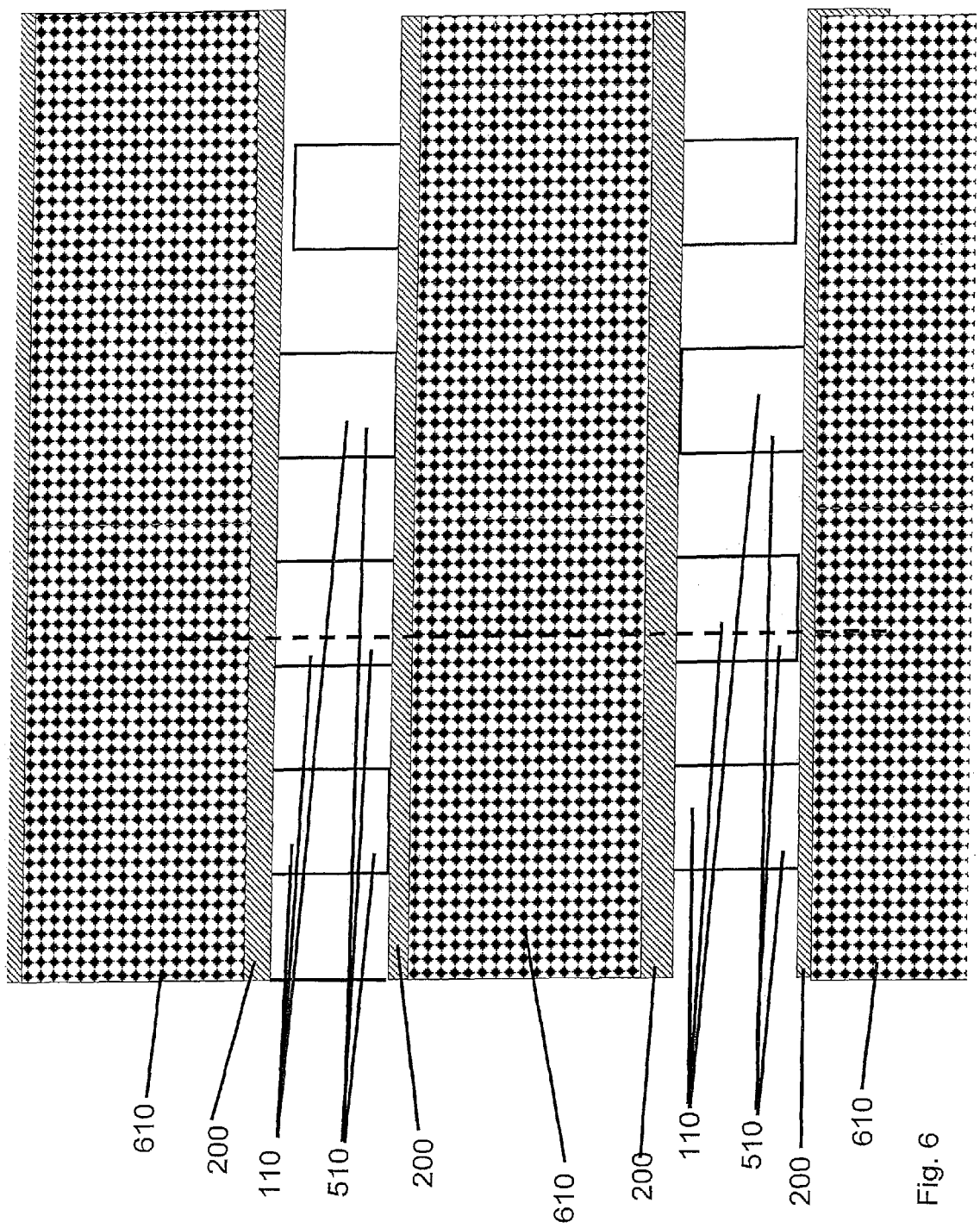
FIG. 6 depicts the top view after deposition of stripes of photo resist

FIG. 6 then shows a top view onto the surface of the structure after depositing and structuring a layer of photo resist 610 in order to protect the areas where the bit line contacts will be produced in the next processing steps. Said memory elements contacts will be produced on the silicon 510 deposited between the gate line stacks and the ILD. Accordingly the memory cells will be produced on the silicon 510.

Figure 7:
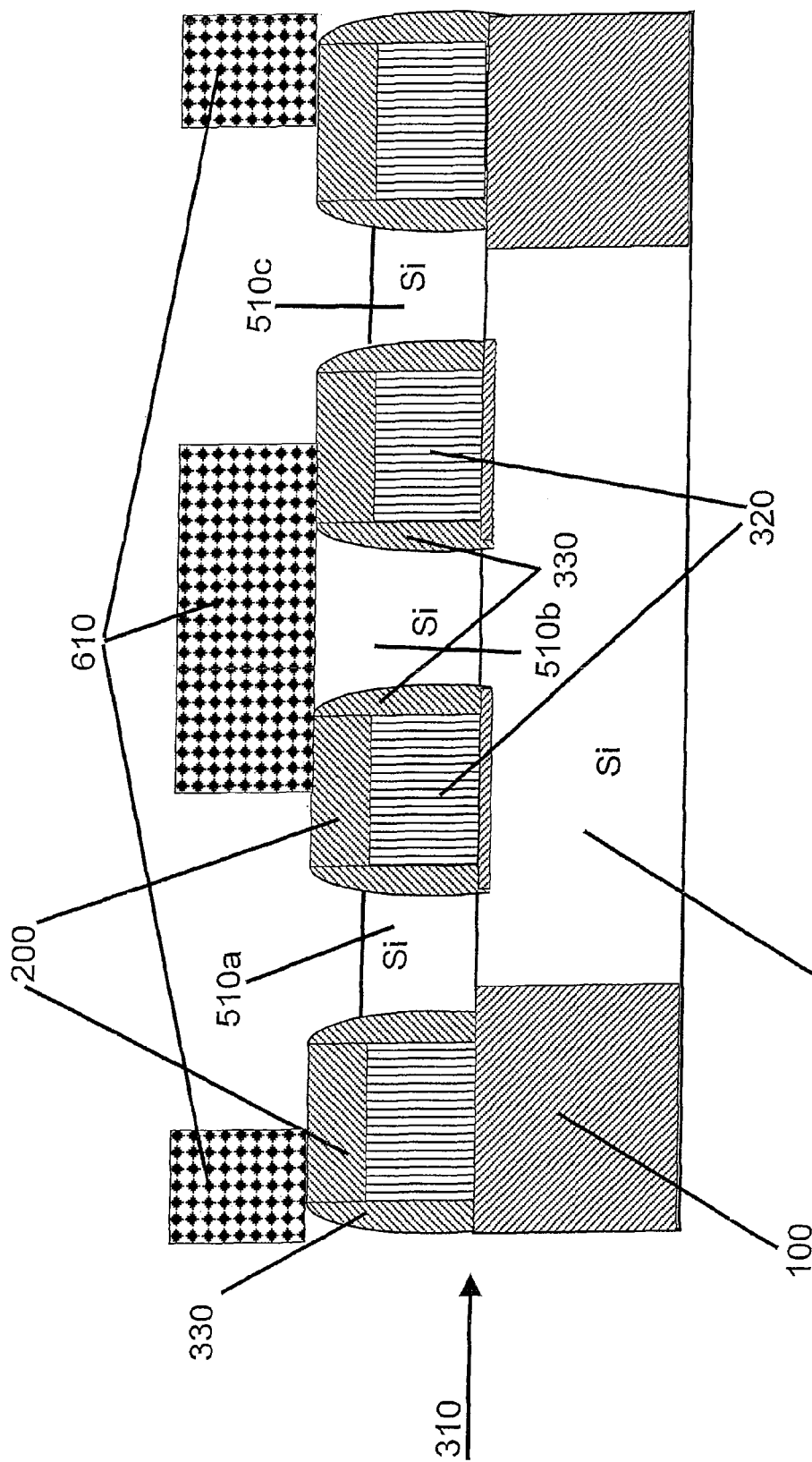
FIG. 7 depicts the cross sectional view after selective etching of silicon to recess the gap filling silicon

After the stripes of photo resist 610 have been formed as shown in the drawing the silicon 510 is etched selectively in order to recess it. This is also shown in FIG. 7, which depicts a cross sectional view as shown in FIG. 5, but after performing the above mentioned processing steps of forming the photo resist stripes and subsequent selective etching of silicon, which can be a dry, chemical, for example a reactive ion etching (rie) process. The selective etching of the silicon causes the recession of the silicon 510 not covered by a photo resist layer. Accordingly the silicon 510*a* and 510*c* are recessed, as they are not covered, whereas the silicon 510*b* is maintained without change. This etching process is performed until the height of the silicon 510*a* and 510*c* is recessed significantly, so as to provide an increasing opening above said silicon areas 510*a* and 510*c*.

Figure 8:
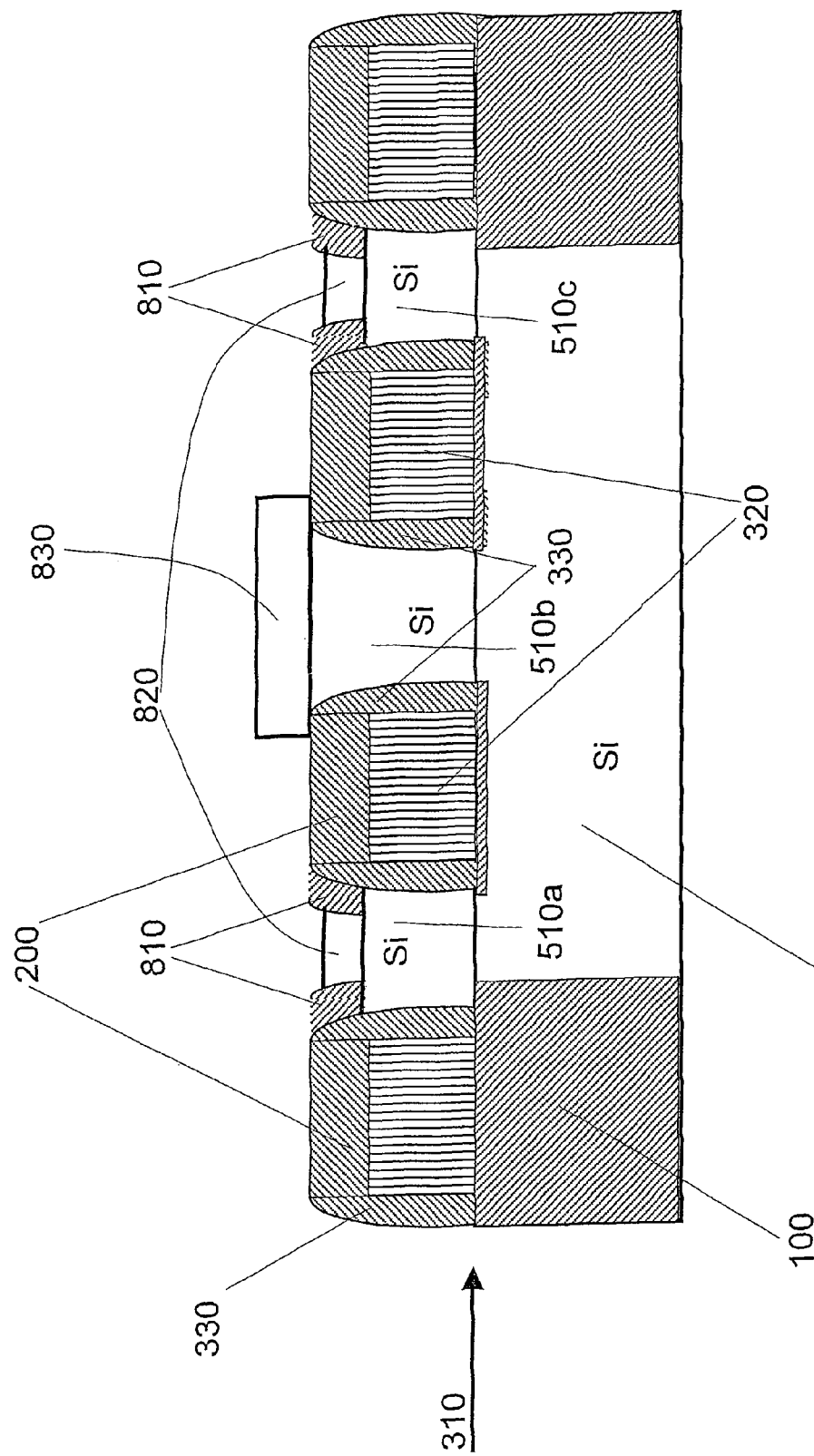
FIG. 8 illustrates the cross sectional view after forming spacers and after growth of silicon on the gap filling silicon

FIG. 8 shows the cross sectional view of FIG. 7 after removal of the stripes of photo resist, which can be achieved by a conventional oxygen plasma processing, and producing spacers 810 on top of the silicon 510*a* and 510*c* and—horizontally—between the insulating spacers 330. These spacers 810 can be formed from any suitable material such as $SiO_2$ or SiN by a conventional process as described above for the insulating spacers 330.

After the spacers 810 have been formed silicon 820 is epitactically grown on the silicon 510*a* and 510*c* to an extend so as to nearly fill the remaining gap between the spacers 810. Also silicon 830 is grown on the silicon 510*b*. Subsequently a salicidation with cobalt silicon (CoSi) or nickel silicon (NiSi) is performed to reduce contact resistances. As the salicidation takes place on the silicon surfaces only, the salicidation is self-aligned.

Figure 9:
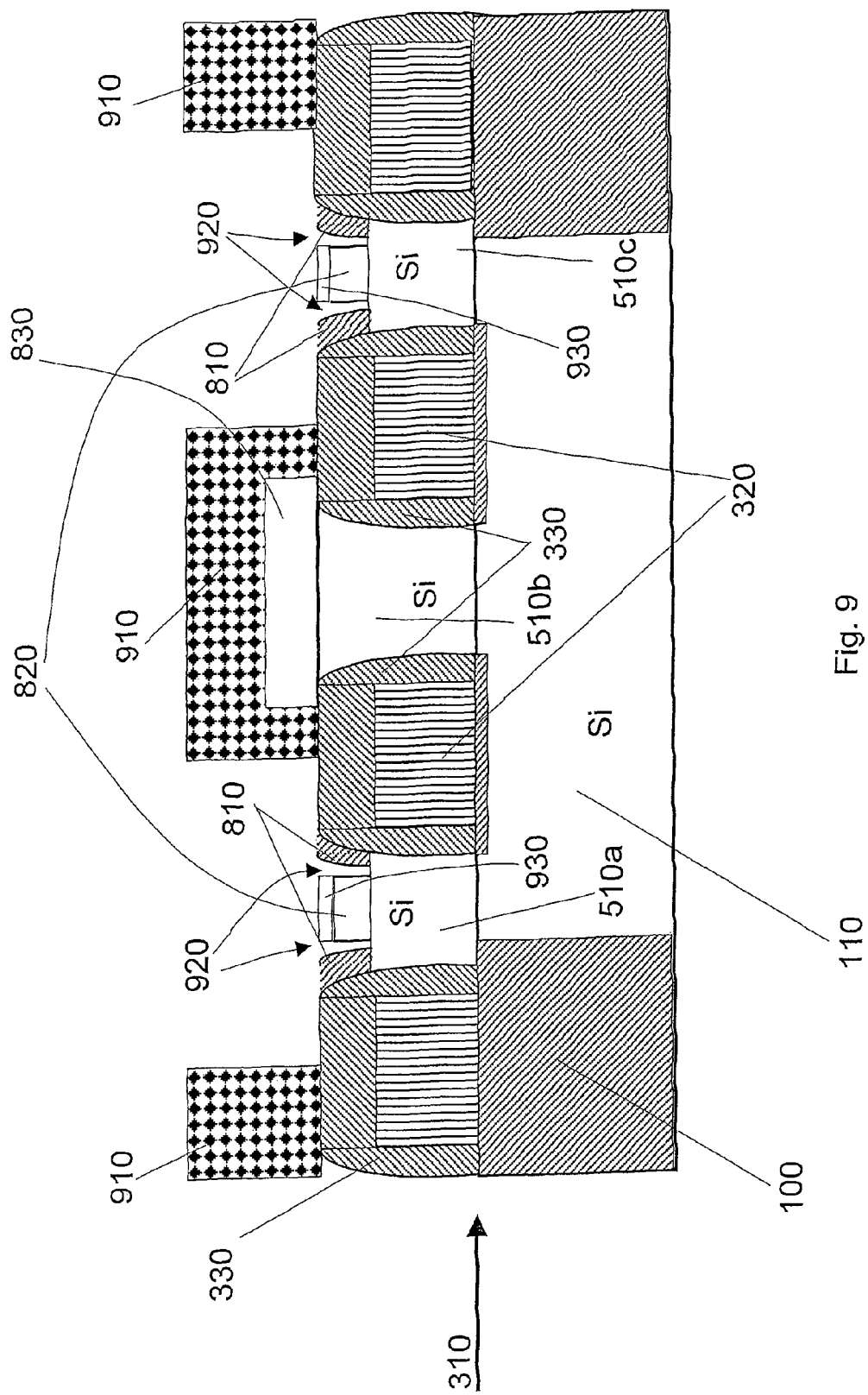
FIG. 9 shows the cross sectional view after a HF dip to recess the spacers and after deposition of a catalyst

FIG. 9 schematically depicts the cross sectional view after a layer of photo resist has been deposited on the structure, in particular in the form of stripes 910, which in this view are running into the paper plane, covering the structure where the bit line contacts will be formed, and with the exception of the area around the spacers 810 and the silicon 820, which will be the area of contacting the memory cells, in particular the area to form a contact for coupling to a volume of switching active material.

After having formed said stripes of photo resist 910, a diluted hydrogen-fluoride (HF) dip is performed to recess the spacers 810, such that small chasms 920 are formed between the silicon 820 and the spacers 810. Unlike as shown in the drawing the chasms typically will not have an obtuse, but a sharp end.

Subsequently to shaping the chasms, a suitable catalyst 930 for forming a nanowire or nanofiber or nanotube is deposited on the silicided areas 820. The catalyst can be a silicide forming metal, for example Ti, Pd, Pt, Au, Cu, Co, Cr, Hf, Ir, Mn, Mo, Ni, Rh, Ta, W, Zr, which can be deposited for example by an selective electroless deposition method, such that the catalyst is deposited on the silicided areas 820 only, as known e.g. from U.S. Pat. No. 6,787,450. Note that any catalyst suitable for starting to grow a nanotube or nanowire or nanofiber can be used using any suitable deposition method.

Figure 10:
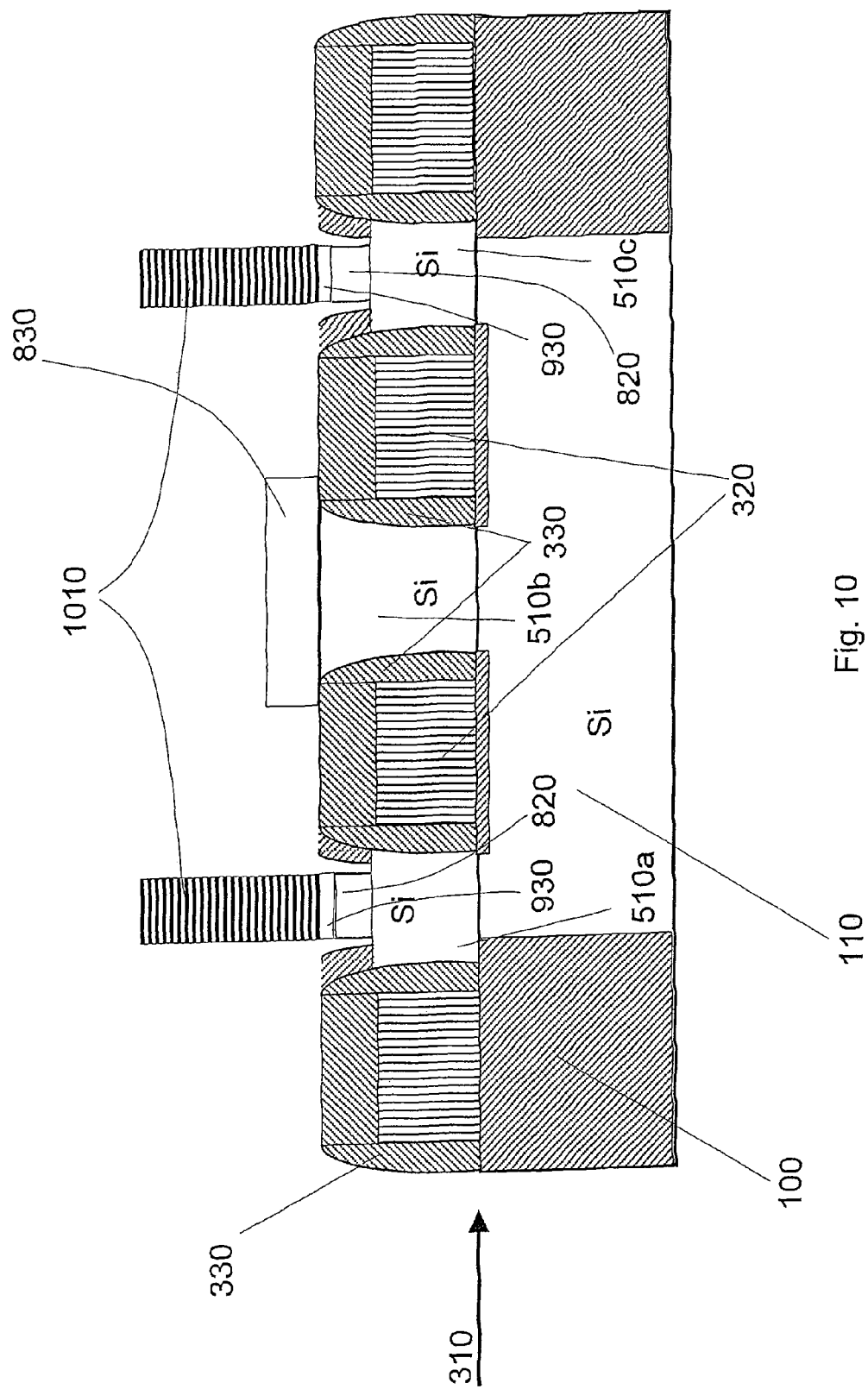
FIG. 10 shows the cross sectional view with nanowires grown on the catalyst

The next processing steps are illustrated in FIG. 10, wherein the photo resist has been removed by using a conventional process. Furthermore the catalyst has been heated for coagulation thus scaling down the base area of the catalyst before a nanowire 1010 has been grown on the catalyst. The growth of the nanowire 1010 can be performed for example by a method described in "Nanowire Superlattices" by Charles M. Lieber in NANO LETTERS, Vol. 2 No. 2, Feb. 2002 or in "Diameter-controlled synthesis of single-crystal silicon nanowires" by Yi Cui et al, Applied Physics Letters, Vol 78 No 75, 9 Apr. 2001, or "Synthesis and characterization of silicon carbide, silicon oxynitride and silicon nitride nanowires", Gautam Gundiah et al, J. Mater. Chem., 2002, 12, 1606-1611, or "Optical and electrical transport properties in silicon carbide nanowires, Han-Kyu Seong, Applied Physics letters Vol 85, No 7, or "Formation of Silicon Carbide Nanotubes and Nanowires via Reaction of silicon (from Disproportionation of Silicon Monoxide) with Carbon Nanotubes, Sun X H et al, J Am Chem Soc. 2002 Dec. 4, 14464-71, or "A Simple Method To Synthesize Nanowires" by Yingjiu Zhang et al, Chem. Mater. 2002, 14, 3564-3568, or "Si—N nanowire formation from Silicon nano and microparticles, by Chandana Rath et al, Mat. Res. Soc. Symp. Proc. Vol 789© 2004 Materials Research Society N3.20.1, or in "Investigation on the growth of Boron Carbide Nanowires" by Renzhi Ma et al, Chem. Mater. 2002, 14, 4403-4407, or in "Fabrication of ZnS/SiC nanocables, SiC-shelled ZnS nanoribbos (and sheets), and SiC nanotubes (and tubes)" by J. Q. Hu et al, Applied Physics Letters Vol. 85, No 14, October 2004, or in "Synthesis of boron nitride nanotubes from carbon nanotubes by a substitution reaction" by Weiqiang Han et al, Applied Physics Letters Vol 73, No 21 of 23 Nov. 1998.

The nanowire 1010 is non-conducting or semi-conducting. Although any non-conducting material such as any non-conducting silicon derivate like SiN can be used, an intrinsic silicon nanowire is preferred.

Typically the nanowire has a diameter of 30 nanometers and a height of 50 to 200 nanometers.

Figure 11:
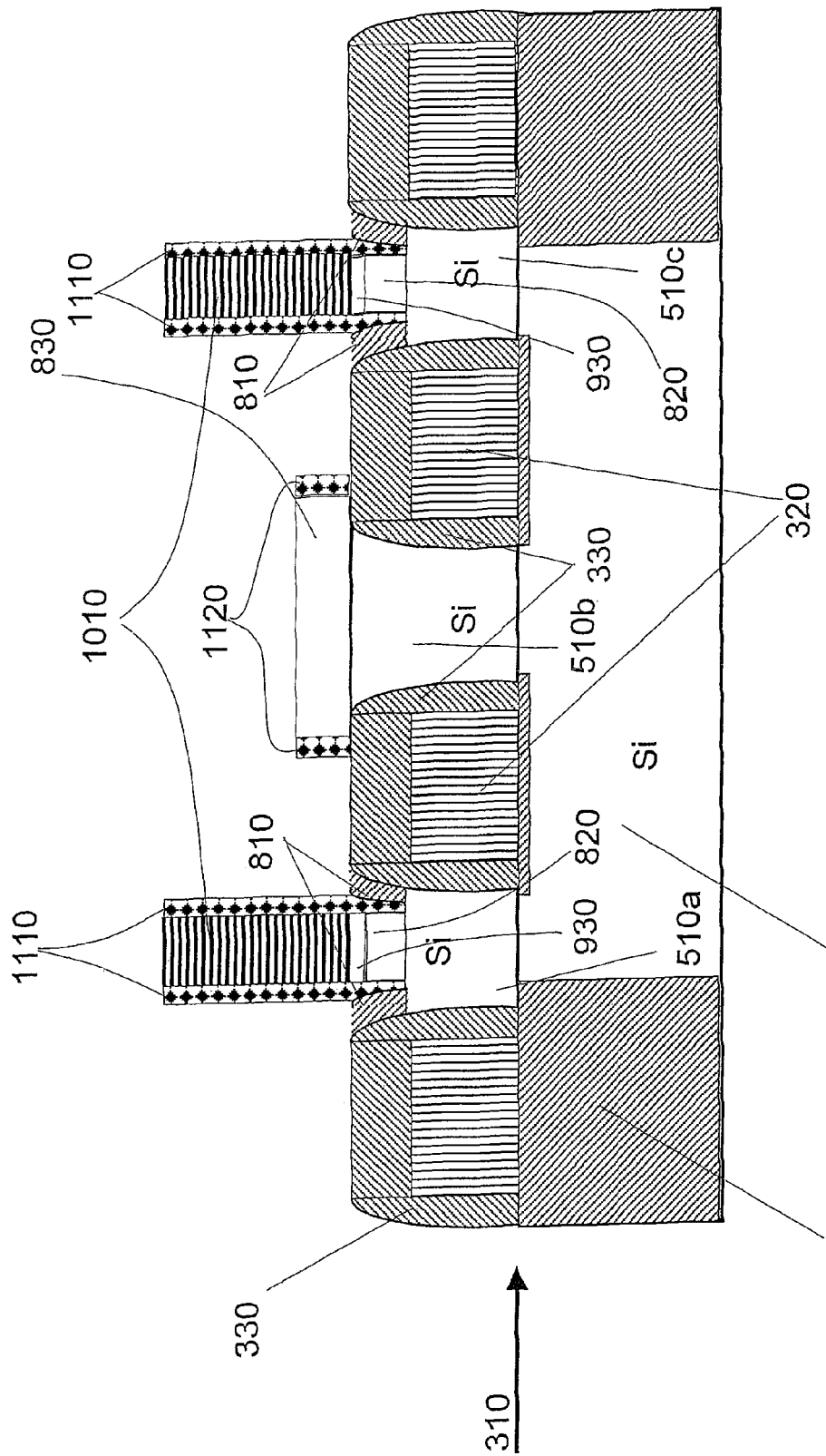
FIG. 11 illustrates the cross sectional view with tubes of conducting material surrounding the nanowires

FIG. 11 depicts the cross sectional view along cut line X-X' after a nanotube 1110 of conducting material has been formed around the nanowires 1010. That is the nanowires 1010 have been used as a shaping die or mould for producing the nanotubes 1110 by depositing a liner of the conducting material, which at first covers the entire surface of the chip. Subsequently an anisotropic spacer etch is performed, which removes the conducting material from any horizontal surface, but substantially leaves the material at vertical surfaces, such that as a result the tubes are produced. In this way tubes 1110 of conducting material have been produced around the nanowires 1010. According to the direction of the nanowires, the rotation-axis of the tubes is perpendicular to the reference plane.

The conducting material of the nanotubes can be any suitable conducting material, preferably titanium nitride (TiN), which can be deposited by a chemical vapor deposition (CVD) or an atomic layer deposition (ALD) process, which provide a good control of the thickness of the deposited layer. Typically the thickness of the deposited TiN layer is less than 10 nanometers, preferably less than 5 nanometers and in particular below 2 nanometers.

The chasms between the spacers 810 and the silicon 820 and the catalyst 930 respectively have been filled with the conducting material of the nanotubes. In this way the nanotubes 1110 have a good electrical connection to the silicon 820 and 510*a*, 510*c*, wherein 510*a* is—as mentioned above—the drain of a first transistor and 510*c* is the drain of a second selection transistor respectively. Consequently the tubes 1110 are coupled to the drain of a first and a second transistor respectively. In this way each nanotube 1110 forms a contact to the drain of a transistor and will be used, as will become clear later, as a contact to a volume of phase change material.

Furthermore spacers 1120 of the conducting material have been formed at the sidewalls of silicon 830. These spacers have not been formed intentionally but as a side effect when depositing the TiN layer and are left without any further treatment, as they do neither fulfill a specific purpose nor bother.

Figure 12:
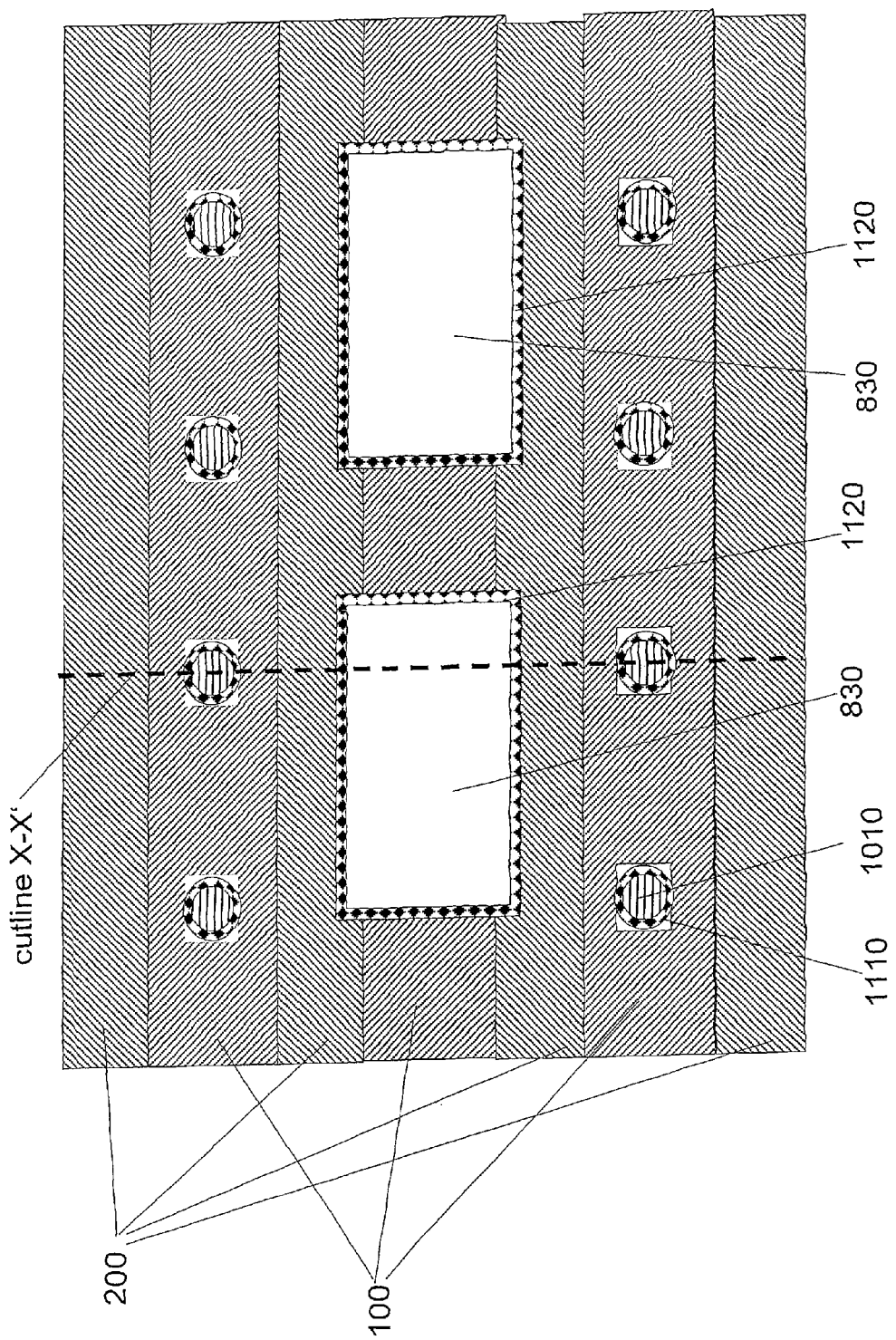
FIG. 12 shows a top view on the layout of the structure illustrating the layout of the bottom electrode contacts

FIG. 12 shows a top view on the surface of the chip illustrating the layout after nanowires 1010 and the ring-shaped contacts, namely the nanotubes 1110 have been formed. Further on the spacers 1120 arranged around the blocks of silicon 830, 830 are shown, onto which the bitlines will be formed in later processing steps.

Figure 13:
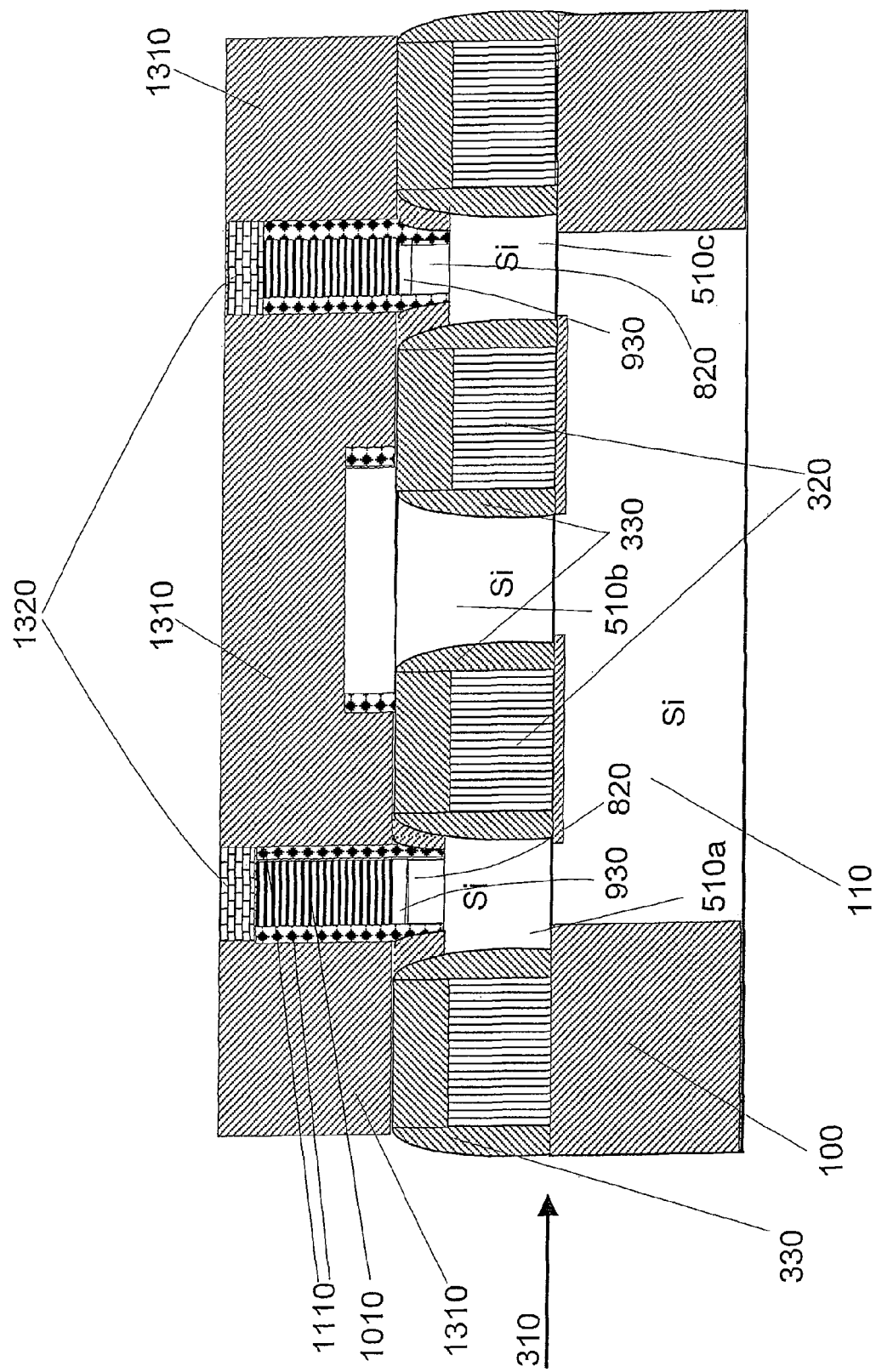
FIG. 13 depicts the cross sectional view after forming volumes of switching active material on top of the bottom electrode contacts

Subsequently and as shown in FIG. 13 an interlayer dielectric (ILD) 1310 is deposited on the structure, which is planarized by a conventional method, e.g. a CMP processing, wherein the planarization stops at the top of the nanotubes 1110 and the nanowires 1010 respectively. Thus the ILD covers the entire structure with the exception of the nanowires 1010 surrounded by the ring-shaped contacts—the nanotubes—1110. Accordingly in a top view only the nanowires 1010 surround by the nanotubes 1110 embedded in the interlayer dielectric 1310 would be visible.

Further on the cross sectional view shows the volumes of switching active material 1320 contacting the ring-shaped front faces of the nanotubes 1110. For forming the volumes of switching active material the titanium nitride of the ring-shaped contacts and the material of the nanowires 1010, which can be intrinsic silicon, is selectively etched, to form a recess in the surface of the structure above every ring-shaped contact 1110. The bottom of the recess is thus formed by the nanowire 1010 and the ring-shaped front face of a nanotube 1110. Subsequently to forming the recesses the switching active material is deposited on the structure for filling the recesses. The switching active material, which may be any conventional switching active material, preferably phase change material, can be deposited by any conventional process. Then the surface of the chip is again planarized using a conventional processing method, e.g. CMP, in order to remove the surplus of phase change material, which was not deposited in a recess, but on the surface structure.

Figure 14:
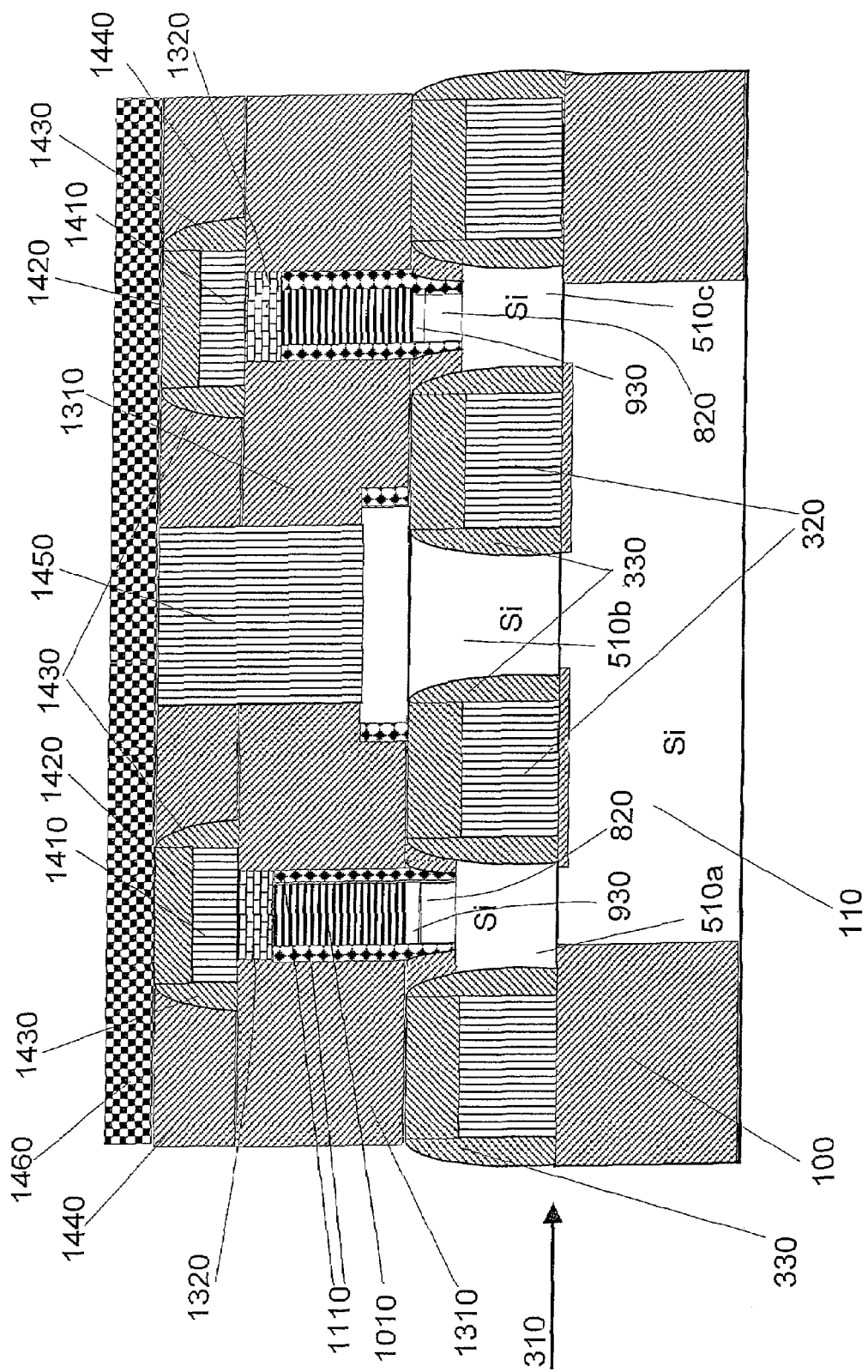
FIG. 14 depicts the cross sectional view showing the memory cells with a selection transistor, a volume of switching active material and a nanotube of conducting material as bottom electrode contact according to the invention

FIG. 14 depicts the cross sectional view after further processing in order to couple the volume of switching active material 1320 to a wordline.

A stripe of for example tungsten (W) 1410 forming the top electrode contact to the volume of switching active material 1320 covered by a stripe of insulating material 1420, which typically can be silicon nitride SiN, is formed so that one stripe connects a plurality of volumes of switching active material. In the drawing the stripe 1410 as well as its insulating cover 1420 are running into the paper plane. They have been formed using conventional method steps, namely by depositing the layers and subsequent lithographic and etch processing.

Then insulating spacers 1430 of any suitable insulating material, preferably of the same material as the insulating cover 1420, are produced at the sidewalls of the stack of 1410 and 1420 so as to insulate the sidewalls of the stripe of tungsten. These spacers can be formed conventionally as described above with respect to forming the spacers 330 at the sidewalls of the gate lines 320.

Subsequently another layer of interlayer dielectric 1440 of any suitable insulating material, for example silicon oxide SiO, is deposited on the structure by any conventional method and planarized with respect to the top of the insulating cover 1420.

For coupling the transistors to a bitline a bitline contact 1450 is formed by etching a via into the interlayer dielectric layers 1440 and 1310 by using conventional lithographic processing and etching, wherein the etching is selective to the material of the insulating cover 1420 and spacers 1430, so that even in the case of a huge misalignment from the ideal position the insulating cover 1420 and the spacers 1430 remain without damage. Following the via is filled with a suitable conducting material, for example tungsten (W), and the surface of the structure is again planarized, for example by a conventional method as mentioned above, in order to remove any excessive conductive material.

Optionally and preferably a liner of titanium nitride (TiN) is deposited on the walls of the via before it is filled with tungsten, in particular on the ground of the via in order to prevent the tungsten, that will be used for filling the via, from reacting with the silicon 510*b*. The TiN layer thus serves as a protective coating for the silicon of 510*b*.

Lastly a bitline 1460 is formed on the structure, wherein the shown bitline exemplifies a plurality of bitlines positioned in front of and behind the paper plane of the drawing and wherein each bitline couples a plurality of bitline contacts 1450. In the drawing the bitline 1460 is running parallel to the paper plane and coupling to further bitline contacts 1450 of adjacent memory cells. As the gate lines 320 serve as word lines, bit lines 1460 are arranged orthogonal to the word lines. The bit lines 1460 can be formed by conventional processing steps, namely by depositing a layer of a suitable conducting material and subsequent lithographic processing and etching steps.

In this way an integrated circuit comprising a plurality of memory cells, in particular phase change RAM cells, can be produced. Each memory cell comprises a volume of switching active material 1320 and a selection transistor for selecting one memory cell from the plurality of cells. The front face of a nanotube 1110, as described in the embodiment the bottom electrode contact, forms one electrode contacting the volume of the switching active material 1320. The nanotubes have been produced by first forming nanowires 1010, which subsequently served as a mould for forming nanotubes 1110. As the nanotubes 1110 are contacting the drain of a selection transistor, the volumes of switching active material 1320 are coupled to the drain of a selection transistor via a conducting nanotube.

Alternatively, other selection elements like diodes can be used instead of a selection transistor. The I-V characteristics of a diode (low current at low voltages (=Ioff) and high current at high voltages=Ion)) gives Ion to ioff ratios of e.g. 1E8, which are more than sufficient for a selection device. In this case the formation of selection transistors is no longer required. It is especially advantageous to use vertical diodes, more specifically vertical pn diodes as a selection element. To fabricate such vertical diodes, an array of heavily n+ doped active area silicon lines separated by STI regions are formed constituting the word lines. After depositing an ILD layer (e.g. SiO2), contact holes are formed by conventional litho and etch processing, opening parts of the heavily n+ doped active area. In a next step, single-crystal silicon can be grown by selective epitaxial growth with CVD method on the opened n+ doped active area regions to fill the contact holes. After recessing the silicon by a standard selective etching process, the vertical pn diode is formed inside the contact holes by two sequential ion implantation steps (a first deep n+ implant followed by a shallow p+ implant). Next, the fabrication of the switching active elements can be continued as already described in the other preferred embodiments.

Although specific embodiments of selection devices have been illustrated and described herein, it will be appreciated by those skilled in the art that a variety of other suitable selection elements can be used A heating current for heating the volume or only a part of the volume of switching active material 1320 will flow through bit line 1460 and through bit line contact 1450 into the silicon 510b, which can be seen as a source of the two adjacent transistors. In case that one—or both—of the gate lines 320 has a suitable potential then a conducting channel will be produced in the active area 110. The current correspondingly will flow through 510 to either 510a or 510c—or both—and further to 930. From thereon the current will flow through the sidewalls of 930 into a tube 1110, which forms a bottom electrode contact of a volume of switching active material 1320. The current will leave the switching active material through a top electrode contact 1410 which also forms the ground or reference electrode having ground or a reference potential, and which runs into the paper plane in this view.

Figure 15:
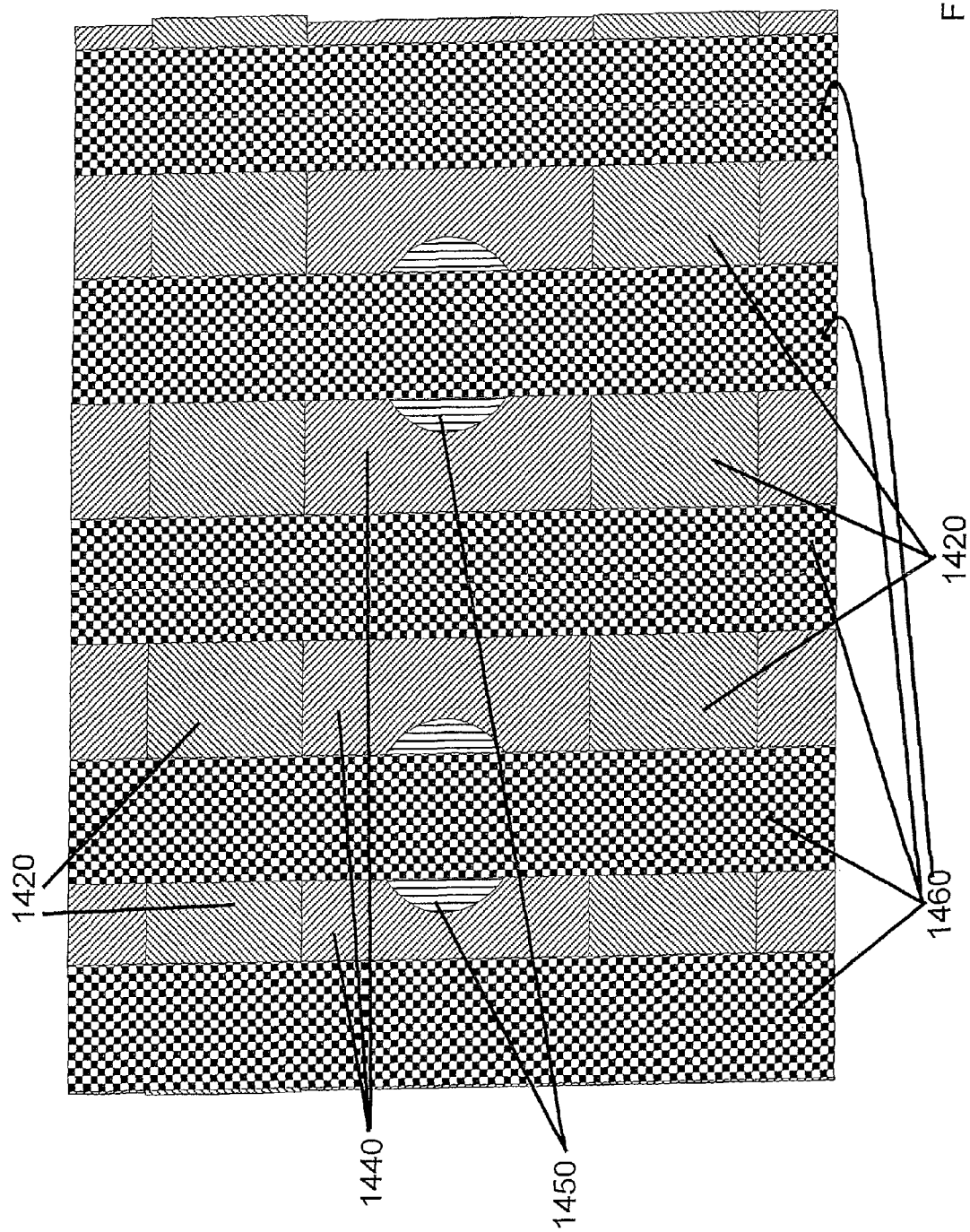
FIG. 15 depicts a top view on the layout of the bitlines, and the bit line contacts

FIG. 15 depicts a top view onto the structure showing the layout. Although in the drawing each of the bit lines 1460 is coupled to only one bit line contact 1450, each bit line 1460 is coupled to a plurality of bit line contacts 1450 and thus to a plurality of memory cells in bit line direction, wherein the other bit line contacts are not shown in this top view. Each bit line 1460 is further coupled to logic—not shown—for sensing the voltage or current level of the bit line.

A further layer of interlayer dielectric filling the gaps between the bit lines 1460 is omitted in this view, as otherwise the layers below would be invisible in this view.

The bit line contacts 1450 are circumferentially embedded in non-conducting inter layer dielectric 1440.

Lastly the insulating cover stripes 1420, which cover the top electrode contacts of the volumes of switching active material are shown.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   an array of memory cells;
   wherein each memory cell comprises a volume of switching active material and a selection element;
   said volume of switching active material being contacted by a first end of a nanotube, the nanotube having a ring-shaped contact formed around a non-conducting nanowire;
   wherein the material of the nanotube is a metal;
   wherein the switching active material is a phase change material; and
   wherein the selection element is provided with at least one source/drain contact, an upper surface of the at least one source/drain contact is disposed with a silicon contact, and the selection element is further provided with at least one spacer such that the upper surface of the at least one source/drain contact, the silicon contact, and the at least one spacer defines a chasm; wherein a second end of the nanotube fills the chasm and surrounds the silicon contact, thereby forming a good electrical connection between the nanotube and the selection element.

2. The integrated circuit of claim 1, wherein the ring-shaped contact is formed as a spacer around the nanowire.

3. The integrated circuit of claim 1, wherein the thickness of the ring-shaped contact is less than 10 nanometers.

4. The integrated circuit of claim 3, wherein the thickness of the ring-shaped contact is less than 2 nanometers.

5. The integrated circuit of claim 1, wherein the material of the ring-shaped contact is titanium nitride.

6. The integrated circuit of claim 1, wherein the inner diameter of the ring-shaped contact is equal to or less than 65 nanometers.

7. An integrated circuit comprising:
   a plurality of memory cells;
   each memory cell comprising a volume of switching active material, a selection element, and a nanotube of conducting material formed as a layer of conducting material surrounding a nanowire of non-conducting material;
   wherein the volume of switching active material is coupled to the selection element via the nanotube;
   wherein a first ring-shaped front face of the nanotube forms a contact to the volume of switching active material;
   wherein the material of the first ring-shaped front face is a metal;
   wherein the switching active material is a phase change material;
   wherein the selection element and a spacer define a chasm such that the nanotube substantially fills the chasm thereby forming good electrical connection between the selection element and a second end of the nanotube; and
wherein at the second end of the nanotube the outer diameter of the nanotube decreases.

8. The integrated circuit of claim 7, wherein the second end of the nanotube is coupled to another conductor.

9. The integrated circuit of claim 8, wherein the second end of the nanotube is coupled at its inner side to the drain of the selection element.

10. The integrated circuit of claim 7, wherein the layer of conducting material is formed as a spacer around the nanowire.

11. The integrated circuit of claim 7, wherein the conducting material of the nanotube is titanium nitride (TiN).

12. The integrated circuit of claim 7, wherein the non-conducting material of the nanowire is intrinsic silicon.

13. The integrated circuit of claim 7, wherein the inner diameter of the nanotube is less than 30 nanometers.

14. The integrated circuit of claim 7, wherein the thickness of the wall of the nanotube is less than 10 nanometers, preferably less than 2 nanometers.

15. The integrated circuit of claim 7, wherein the length of the nanotube is between 50 and 200 nanometers.

16. An integrated circuit with a plurality of memory cells formed on a wafer, wherein the surface of the original wafer serves as a horizontal reference plane, and wherein each of the memory cells comprises:
 a volume of switching active material;
 a selection element for selecting a memory cell from the plurality of memory cells; and
 a nanotube of conducting material for connecting the volume of switching active material, the rotation axis of the nanotube being perpendicular to the reference plane, the nanotube formed as a layer of conducting material surrounding a nanowire of non-conducting material;
 wherein a ring-shaped front face at a first end of the nanotube forms a metal contact to the volume of switching active material;
 wherein the switching active material is a phase change material; and
 wherein the selection element is provided with at least one source/drain contact, an upper surface of the at least one source/drain contact is disposed with a silicon contact, and the selection element is further provided with at least one spacer such that the upper surface of the at least one source/drain contact, the silicon contact, and the at least one spacer defines a chasm; wherein a second end of the nanotube fills the chasm and surrounds the silicon contact, thereby forming a good electrical connection between the nanotube and the selection element.

17. The integrated circuit of claim 16, wherein the front face of the nanotube forms a bottom electrode contact of the volume of switching active material.

18. The integrated circuit of claim 16, wherein the volume of the switching active material is coupled to the selection element via the nanotube.

19. The integrated circuit of claim 16, wherein the nanotube is contacted at its inside at the opposite end of that coupled to the volume of switching active material.

20. The integrated circuit of claim 16, wherein the inner diameter of the nanotube is less than 30 nanometers.

21. The integrated circuit of claim 16, wherein the thickness of the wall of the nanotube is less than 10 nanometers, preferably less than 2 nanometers.

22. The integrated circuit of claim 16, wherein the nanotube is coupled with a second end to a drain of the selection element.

23. The integrated circuit of claim 16, wherein the material of the nanotube is titanium nitride.

24. The integrated circuit of claim 16, wherein the switching active material is phase change material.

25. An electronic system, comprising the integrated circuit of claim 1.

* * * * *